US008665600B2

(12) United States Patent
Wernicke

(10) Patent No.: US 8,665,600 B2
(45) Date of Patent: Mar. 4, 2014

(54) SINGLE SIDED FEED CIRCUIT PROVIDING DUAL POLARIZATION

(75) Inventor: Ryan Wernicke, Southlake, TX (US)

(73) Assignee: Ratheon Company, Waltham, MA (US)

( * ) Notice: Subject to any disclaimer, the term of this patent is extended or adjusted under 35 U.S.C. 154(b) by 546 days.

(21) Appl. No.: 12/955,394

(22) Filed: Nov. 29, 2010

(65) Prior Publication Data

US 2012/0134118 A1 May 31, 2012

(51) Int. Cl.

| | |
|---|---|
| ***H05K 1/00*** | (2006.01) |
| ***H05K 1/18*** | (2006.01) |
| ***H05K 7/00*** | (2006.01) |
| ***H01Q 1/38*** | (2006.01) |

(52) U.S. Cl.

CPC .................................... *H01Q 1/38* (2013.01)
USPC ........................................ 361/748; 174/255

(58) Field of Classification Search

USPC .......... 361/748, 753, 805, 807; 174/250–258; 343/795, 797, 853, 893, 767, 770
See application file for complete search history.

(56) References Cited

U.S. PATENT DOCUMENTS

| | | | | |
|---|---|---|---|---|
| 6,034,649 | A * | 3/2000 | Wilson et al. | 343/795 |
| 6,850,203 | B1 | 2/2005 | Schuneman et al. | |
| 6,867,742 | B1 | 3/2005 | Irion, II et al. | |
| 6,963,312 | B2 | 11/2005 | Schuneman et al. | |
| 8,232,928 | B2 * | 7/2012 | Johansen et al. | 343/853 |
| 2005/0264448 | A1 | 12/2005 | Cox et al. | |
| 2007/0046558 | A1 * | 3/2007 | Tillery | 343/797 |
| 2007/0159395 | A1 | 7/2007 | Sievenpiper et al. | |
| 2009/0315802 | A1 | 12/2009 | Johansen et al. | |
| 2009/0317985 | A1 | 12/2009 | Irion, II et al. | |
| 2010/0123619 | A1 | 5/2010 | Shijo et al. | |
| 2011/0057852 | A1 * | 3/2011 | Holland et al. | 343/795 |

OTHER PUBLICATIONS

Extended European Search Report for European Application No. 11190954.5, Extended European Search Report dated Feb. 28, 2012 and mailed Mar. 6, 2012 (6 pgs.).

* cited by examiner

*Primary Examiner* — Yuriy Semenenko
(74) *Attorney, Agent, or Firm* — Christie, Parker & Hale, LLP

(57) ABSTRACT

A feed circuit for connecting adjacent components includes: a printed circuit board having a first portion and an axis of symmetry extending along a longitudinal direction of the first portion, second portions extending in substantially opposite directions from one end of the first portion, and third portions extending in substantially opposite directions from another end of the first portion; at least two circuits electrically connecting respective ones of the second portions with corresponding ones of the third portions; and connection areas at each of the second portions configured to be connected to one of the adjacent components, and at each of the third portions configured to be connected to another one of the adjacent components.

18 Claims, 6 Drawing Sheets

SINGLE SIDED FEED CIRCUIT PROVIDING DUAL POLARIZATION

BACKGROUND OF THE INVENTION

1. Field of the Invention

The present invention relates generally to a feed circuit design for connecting adjacent components, such as antenna elements, and more particularly to a feed circuit design having improved structure and support, for connecting adjacent components while utilizing a reduced number of parts.

2. Description of Related Art

Phased array antennas have seen an increase in range of applications in recent years in various commercial markets. With respect to the defense market, phased array antennas have seen an increase in application in, for example, communications and radar systems, among various other applications.

For example, a phased array antenna developed by the Raytheon company includes a plurality of transmit/receive integrated microwave module (TRIMM) plates or assemblies that are arranged adjacent to one another in an array assembly, and a plurality of radiating elements extending from each of the TRIMM assemblies. The TRIMM assemblies each include a column portion to which other components are attached. Electrical performance of a phased array antenna depends on various factors, for example, the orientation of the various features in the antenna as well as the arrangement and intercommunication between these various features. Such features and/or factors may therefore affect the effectiveness, stability, and/or optimization of certain performance characteristics of different antennas.

Among the features which contribute to the communication between adjacent TRIMM assemblies in the above phased array antennas are feed circuits. Generally, feed circuits are utilized because typically in such phased array antennas, adjacent TRIMM assemblies do not directly contact one another. Due to manufacturing tolerances and variations between different TRIMM assemblies, if components are stacked to contact one another, inconsistencies from TRIMM assembly to TRIMM assembly may cause imprecise positioning between radiating elements, adversely affecting electrical performance, thereby reducing the effectiveness of the antennas. Furthermore, in such array assemblies, as the number of TRIMM assemblies in the array increases, any TRIMM assembly inconsistencies may further cause additional deviations from the desired spacing between the radiating elements, as errors may be compounded based on the increased number of TRIMM assemblies, and performance degradation of the antennas as a whole may further be magnified. Therefore, TRIMM assemblies may be arranged with a certain amount of clearance between them, such that a desired precise spacing can be set based on positioning between the radiating elements, rather than between the TRIMM assemblies, so as to eliminate or reduce spacing inconsistencies that would otherwise be caused by the manufacturing variations.

Accordingly, feed circuits have been designed to be placed between adjacent TRIMM assemblies and to bridge the gaps and facilitate communication between the TRIMM assemblies, as well as between the radiating elements associated with the TRIMM assemblies. Since the spacing between the TRIMM assemblies is inconsistent due to the manufacturing variations, such feed circuits are generally made to be flexible so as to accommodate such spacing and positioning variations. As indicated above, manufacturing variations may be caused, for example, by the TRIMM assemblies not being flat and/or, for example, by spacing tolerances between TRIMM assemblies in an array assembly. As such, the feed circuits themselves may be more structurally weak than may be desirable, and may not be provided adequate support by the structure of the TRIMM assemblies. Further, while the radiating elements and the TRIMM assemblies of the phased array antennas, which contribute more significantly to establishment of more precise and effective electric fields of the antennas, have improved over time, feed circuits have seen relatively less development and improvement over the same time.

SUMMARY OF THE INVENTION

Embodiments of the present invention provide a feed circuit for connecting adjacent components in a provided apparatus, the design of the feed circuit providing improved structure and support while maintaining an ability to compensate for manufacturing variations and tolerances, and reducing a number of parts in the apparatus.

According to aspects of an embodiment of the present invention, a feed circuit for connecting adjacent components includes: a printed circuit board having a first portion and an axis of symmetry extending along a longitudinal direction of the first portion, second portions extending in substantially opposite directions from one end of the first portion, and third portions extending in substantially opposite directions from another end of the first portion; at least two circuits electrically connecting respective ones of the second portions with corresponding ones of the third portions; and connection areas at each of the second portions configured to be connected to one of the adjacent components, and at each of the third portions configured to be connected to another one of the adjacent components.

The feed circuit may be configured to connect adjacent components of an antenna assembly.

The respective ones of the second portions may be located on a same side of the axis of symmetry as the respective corresponding third portions.

The feed circuit may further include disks including a ferromagnetic material coupled to the connection areas at each of the second portions. The ferromagnetic material may include nickel.

The connection area at least one of the third portions may include a wirebond pad.

The printed circuit board may include a substrate including liquid crystal polymer.

At least one of the at least two circuits may include an internal stripline circuit.

According to aspects of another embodiment of the present invention, an assembly includes: a plurality of components spaced apart from one another; and at least one feed circuit for connecting at least two adjacent ones of the components, the at least one feed circuit including: a printed circuit board having a first portion and an axis of symmetry extending along a longitudinal direction of the first portion, second portions extending in substantially opposite directions from one end of the first portion, and third portions extending in substantially opposite directions from another end of the first portion; at least two circuits electrically connecting respective ones of the second portions with corresponding ones of the third portions; and connection areas at each of the second portions and at each of the third portions.

Each of the plurality of components may include a plate-shaped base portion and a plurality of support posts extending in substantially a same direction from an end of the base portion, wherein the at least one feed circuit is configured to connect electrical components adjacent to a corresponding support post on one of the base portions with at least two support posts on an adjacent one of the base portions.

The at least one feed circuit may be connected to the electrical components via at least one wirebond pad located at the connection area of one of the third portions of the at least one feed circuit.

The at least one feed circuit may be configured to provide signal polarization along a first axis towards one of the at least two support posts on the adjacent one of the base portions, and signal polarization along a second axis that crosses the first axis towards another one of the at least two support posts on the adjacent one of the base portions.

The at least two support posts on the adjacent one of the base portions may each include at least one magnetic insert, wherein the at least one feed circuit further includes a disk comprising a ferromagnetic material coupled to the connection areas at each of the second portions, and wherein the disks are configured to contact the magnetic inserts of the at least two support posts on the adjacent one of the base portions via a magnetic force. The contacts between the disks and the magnetic inserts may form respective electrical connections between the disks and the magnetic inserts. At least one of the magnetic inserts may include neodymium. The ferromagnetic material may include nickel.

The at least one feed circuit may be attached to a side of the corresponding support post, such that the first portion of the at least one feed circuit extends substantially along a longitudinal direction of the corresponding support post. The assembly may include a plurality of feed circuits attached to respective ones of the support posts on the one of the base portions, wherein the plurality of feed circuits are arranged to be on a same side of the one of the base portions.

BRIEF DESCRIPTION OF THE DRAWINGS

The accompanying drawings, together with the specification, illustrate exemplary embodiments of the present invention, and, together with the description, serve to explain the principles of the present invention, of which.

DETAILED DESCRIPTION OF THE INVENTION

Figure 1:
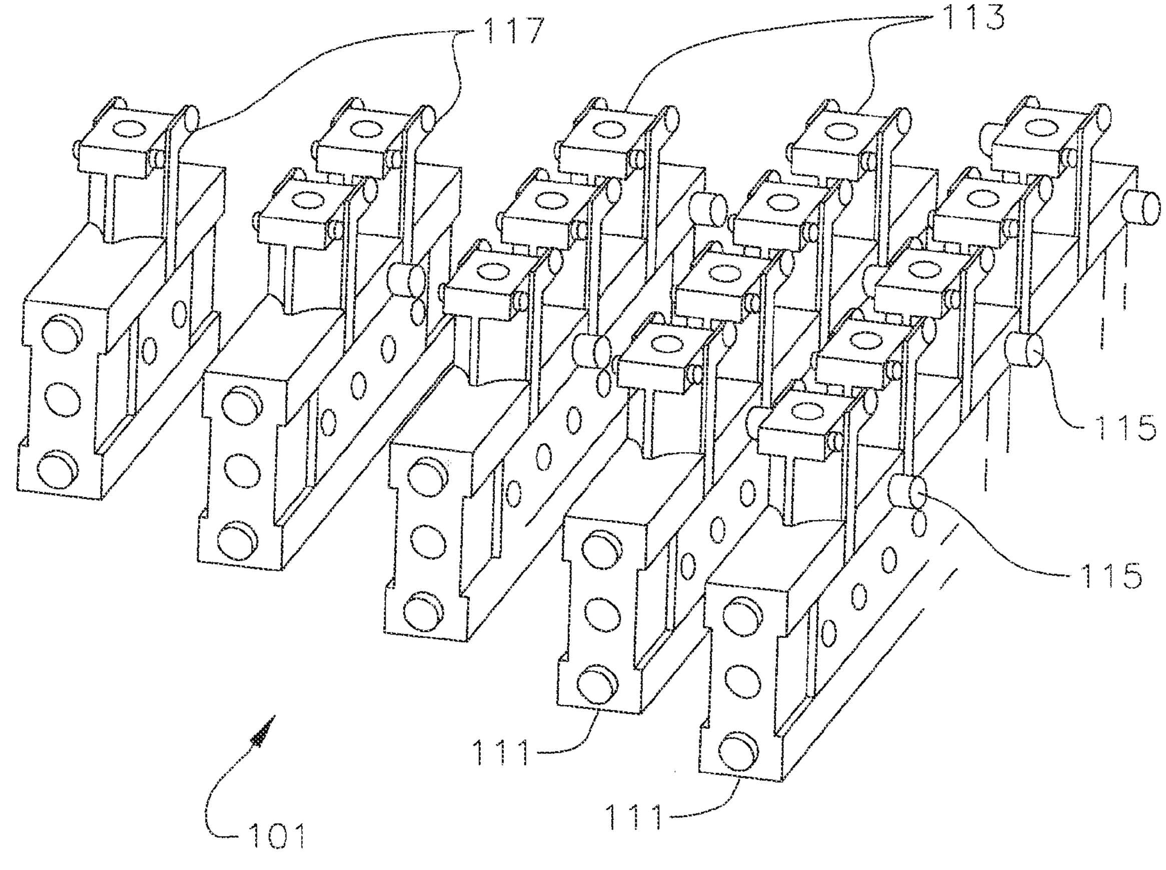
FIG. 1 shows an exploded perspective view of portions of a plurality of TRIMM assemblies of a phased array antenna to which embodiments of the present invention can be applied.

Hereinafter, certain exemplary embodiments according to the present invention will be described with reference to the accompanying drawings. Some of the elements that are not essential to the complete understanding of the present invention are omitted for clarity. In addition, similar elements that appear in different drawings may be referred to by using the same or similar reference numerals.

FIG. 1 is an exploded perspective view of portions of a plurality of transmit/receive integrated microwave module (TRIMM) plates or assemblies of a phased array antenna to which embodiments of the present invention can be applied. Phased array antennas 101 having TRIMM assemblies similar to the TRIMM assemblies illustrated in FIG. 1 have been developed by the Raytheon company. The TRIMM assemblies each includes a column 111, where the columns 111 are arranged adjacent to and spaced apart from one another. In addition to a column 111, each of the TRIMM assemblies may also include a plurality of other features, for example, supports 113 for inserting or installing radiating elements associated with the phased array antenna and interconnection elements, such as dowel pins 115, for holding the TRIMM assemblies together and/or spaced apart at a substantially constant distance from one another, among other features. In addition, the TRIMM assemblies may include a plurality of feed circuits 117, which may be electrically connected to the supports 113 or other portions of the TRIMM assemblies, and which may facilitate electrical connectivity or energy transfer between an associated support 113 and one or more supports 113 on an adjacent TRIMM assembly, or with the column portion 111 of an adjacent TRIMM assembly in general.

In a phased array antenna such as the one described above, polarization of the antenna may depend on the orientation and/or alignment of the electric field radiated by the elements of the phased array antenna. This may, in turn, depend on a spacing between the TRIMM assemblies and/or the radiating elements, the electrical intercommunication between the various elements, and/or the shapes of the radiating elements. For example, when the phased array antenna 101 of FIG. 1 is in an assembled state, gaps may be provided between the columns 111 of the TRIMM assemblies. These gaps may be used to provide clearance for different features located or positioned on or between the columns 111, or as discussed above, may be utilized to provide an exact alignment or spacing between the radiating elements, independent of manufacturing variances with respect to the columns 111. Furthermore, providing such gaps may also prevent or reduce unintended cross-talk between particular portions of the plates, such that electrical communication and/or energy transfer can be more readily controlled and/or managed from plate to plate.

Figure 2A:
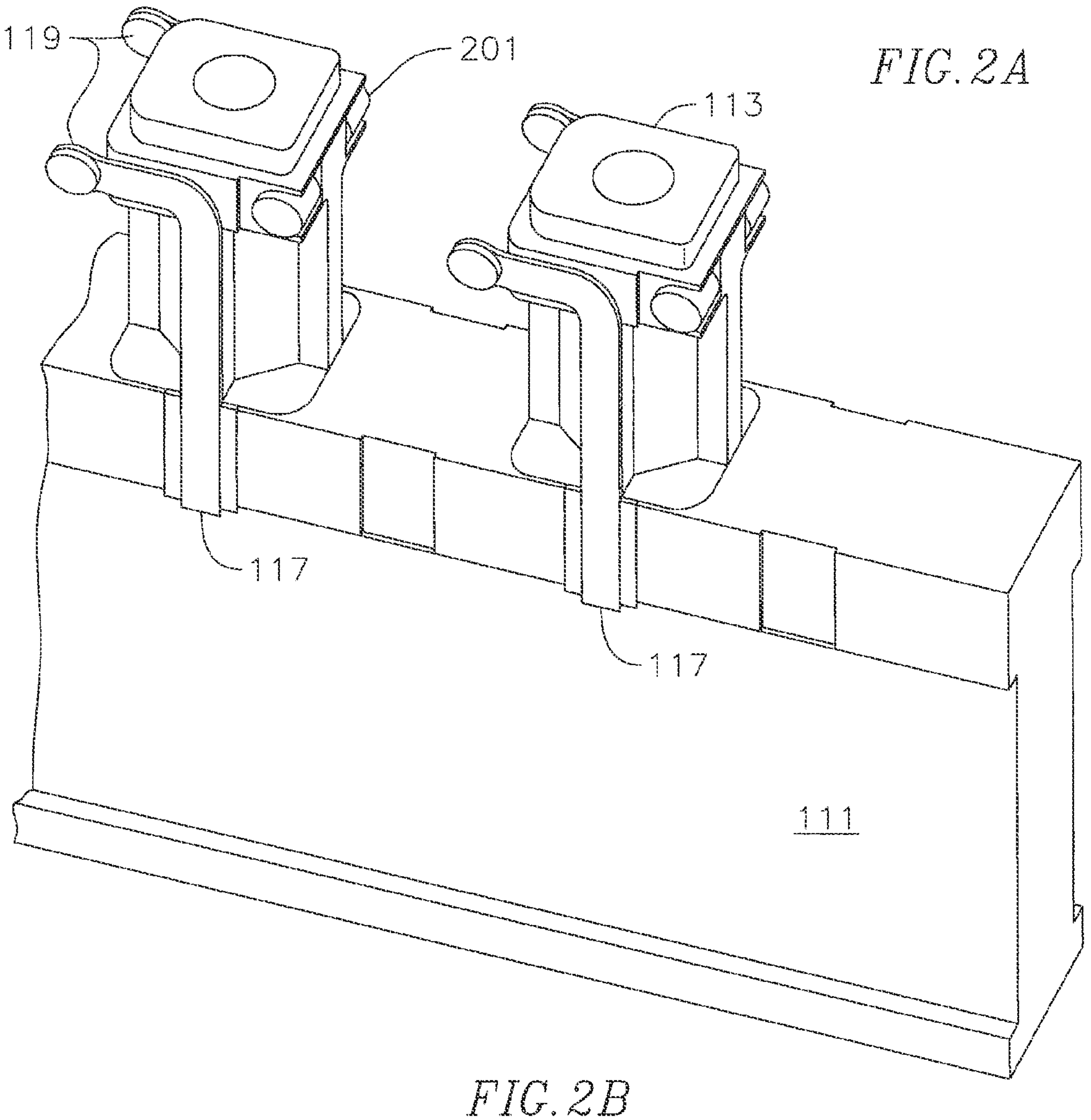
FIG. 2A illustrates a perspective view of a portion of a TRIMM assembly utilizing a first feed circuit design.
Figure 2B:
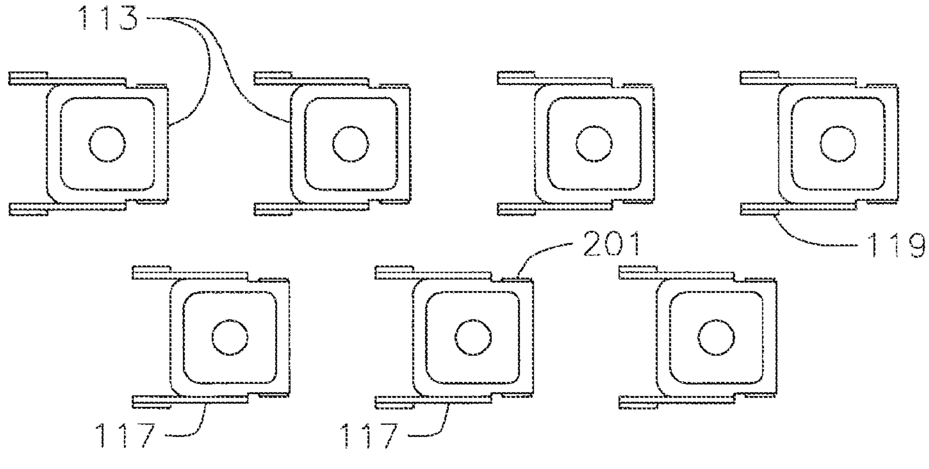
FIG. 2B is a top view showing supports of two partial TRIMM assemblies utilizing the first feed circuit design.

To this effect, the feed circuits 117 may be utilized to facilitate electrical communication or energy transfer between the TRIMM assemblies, and more specifically between the supports 113 and their associated radiating elements. FIGS. 2A and 2B respectively illustrate a perspective view and a top view of portions of TRIMM assemblies utilizing a first feed circuit design, and FIGS. 3A and 3B respectively illustrate a perspective view and a top view of portions of TRIMM assemblies utilizing a second feed circuit design. Each of these designs utilizes a conventional "J" shaped feed circuit design.

FIG. 2A illustrates a perspective view of a portion of a TRIMM assembly utilizing a first "J" shaped feed circuit design. FIG. 2B is a top view showing supports of two partial TRIMM assemblies utilizing the first "J" shaped feed circuit design. Referring to FIGS. 2A and 2B, a first "J" shaped feed circuit design includes a feed circuit 117 having two longitudinal portions meeting at approximately a right angle. The feed circuits 117 are attached to corresponding supports 113 on a column 111. The feed circuits 117 are arranged such that a pair of feed circuits 117 are respectively attached to opposite sides of a corresponding support 113. A first longitudinal portion of the feed circuits 117 is positioned to be substantially vertical along approximately a middle of the side of the support 113 to which it is attached, while a second longitudinal portion of the feed circuits 117 extends substantially perpendicularly from the first portion, such that the first and second portions of each feed circuit 117 lie in a plane substantially parallel to a plane of the column 111. Furthermore, each pair of feed circuits 117 corresponding to a same support 113 have second portions that are directed in substantially a same direction, as can be seen in FIGS. 2A and 2B. The feed circuits 117 may be constructed from, for example, printed circuit board or printed wiring board, and may include associated circuitry to facilitate electrical communication or energy transfer between one end of the first portion and an opposite end of the second portion.

At an end of the second portion of each of the feed circuits 117, a disk 119 for connecting to a magnet may be provided. In FIGS. 2A and 2B, the disks are illustrated as substantially circular, but it is to be understood that the disks can be any shape corresponding to the rest of the apparatus. The disks 119 may be or include a ferromagnetic material, for example, nickel, and may be attached to the feed circuits 117 via, for example, an epoxy or any other suitable adhesive.

In addition, each of the supports 113 may further include magnetic disks or inserts 201. The magnetic inserts 201 may be provided on the supports 113 as illustrated in FIGS. 2A and 2B, or may be otherwise provided and positioned based on configuration of the apparatus. In FIGS. 2A and 2B, the magnetic inserts 201 are provided on sides of the supports 113 on which the feed circuits 117 are also provided, and are arranged to be on a side of the first portions of the feed circuits 117 opposite the side that the corresponding second portion extends. The magnetic inserts may be made of or include, for example, neodymium, or other magnetic element or compound that has similar properties.

FIG. 2B shows portions of two adjacent TRIMM assemblies utilizing the first "J" shaped feed circuit design described in FIG. 2A. FIG. 2B includes a plurality of supports 113 corresponding to two TRIMM assemblies, and their associated feed circuits 117. The supports of the two TRIMM assemblies are illustrated in FIG. 2B to be separated by a large gap, for ease of description, but it is to be understood that in an assembled state, the two TRIMM assemblies are more closely arranged, such that the disks 119 of the feed circuits 117 of one of the columns are able to come into contact with the magnetic inserts 201 of an adjacent column. As can be most clearly seen in FIG. 2B, the columns may be arranged in an array, such that the supports 113 are arranged to be diagonal to one another. This results in the supports 113 and their associated radiating elements being arranged in a substantial slant feed or "egg crate" arrangement.

In addition, in FIG. 2B, it can be seen that each of the disks 119 are substantially aligned with a corresponding magnetic insert 201 of a support 113 of an adjacent TRIMM assembly. In an assembled state, the feed circuits 117 bridge the gaps between the TRIMM assemblies by connecting a corresponding support 113 with an adjacent support 113 via the magnetic connections between the magnetic inserts 201 and the disks 119. The flexibility of the feed circuits 117 allows for the feed circuits 117 to compensate for minor manufacturing variances with respect to the shapes of each of the columns 111 and/or the supports 113. In this manner, communication can be facilitated between supports 113 and their associated radiating elements arranged diagonal to one another. As such, the feed circuits facilitate communication between each of the TRIMM assemblies in an array assembly, and may contribute, for example, to formation of a desired radar signal for the corresponding phased array antenna.

Figure 3A:
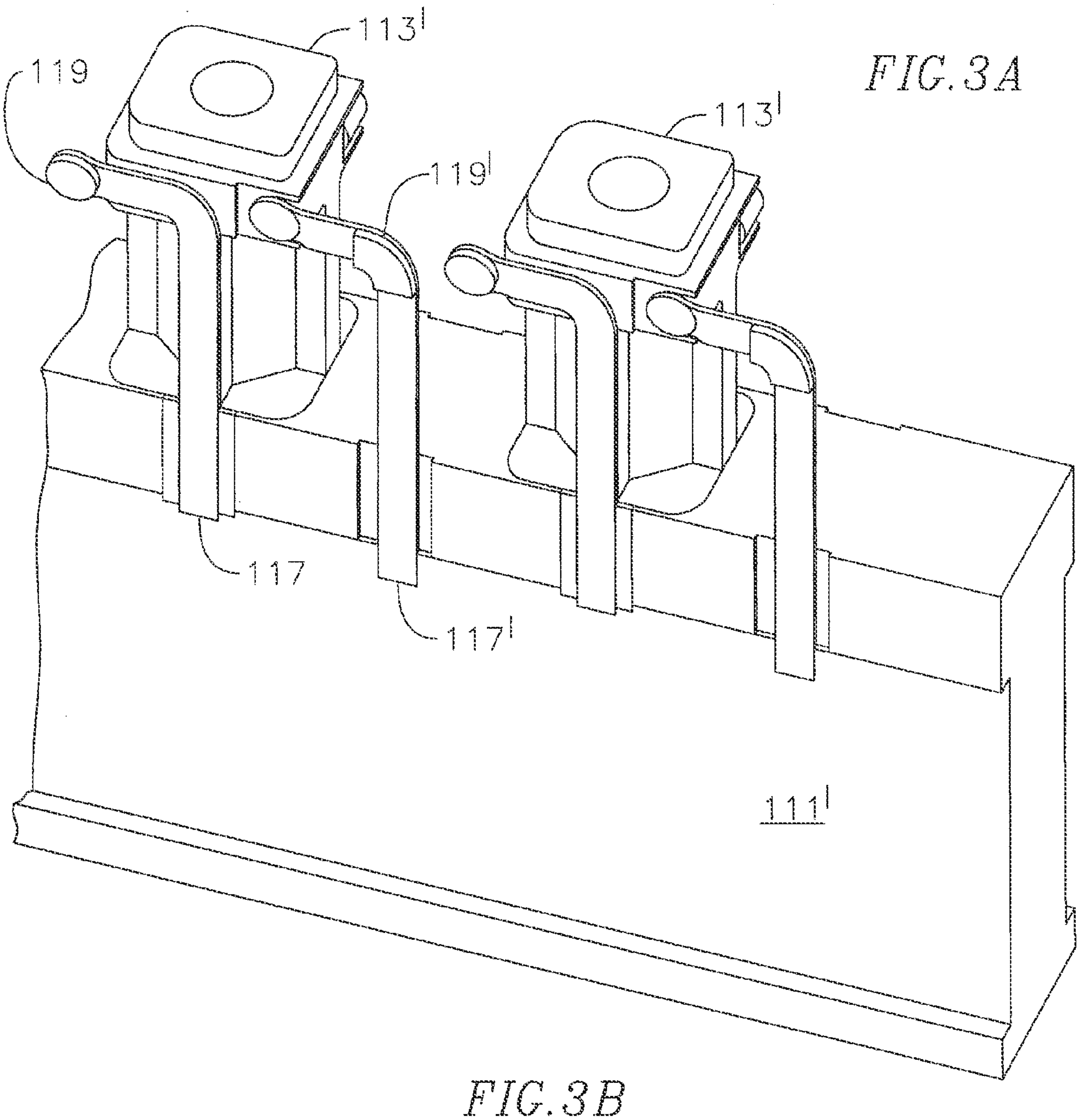
FIG. 3A illustrates a perspective view of a portion of a TRIMM assembly utilizing a second feed circuit design and arrangement.
Figure 3B:
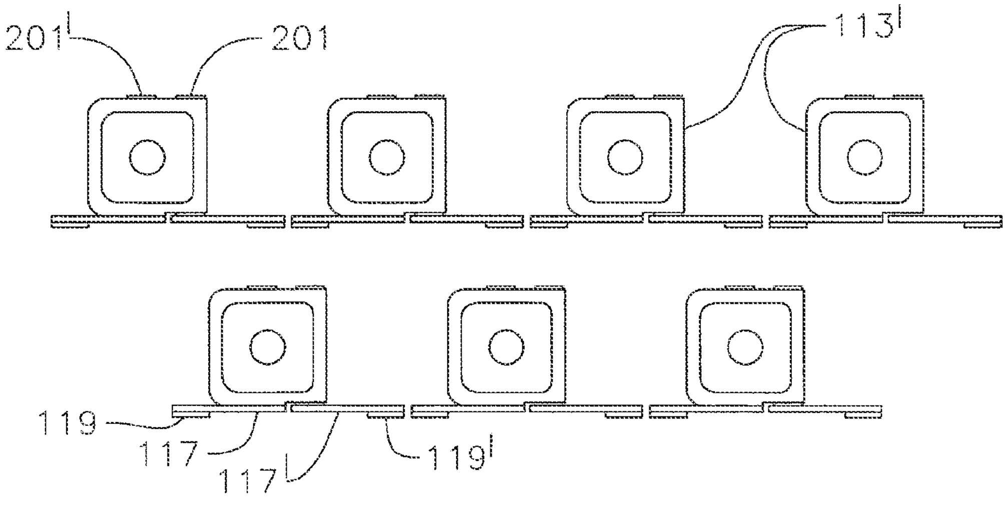
FIG. 3B is a top view showing supports of two partial TRIMM assemblies utilizing the second feed circuit arrangement.

FIG. 3A illustrates a perspective view of a portion of a TRIMM assembly utilizing a second "J" shaped feed circuit arrangement. FIG. 3B is a top view showing supports of two partial TRIMM assemblies utilizing the second "J" shaped feed circuit arrangement. Referring to FIGS. 3A and 3B, the second "J" shaped feed circuit arrangement utilizes a first "J" shaped feed circuit design 117 substantially similarly as described in FIGS. 2A and 2B, as well as a second "J" shaped feed circuit design 117'. Referring to FIG. 3A, the second feed circuit design 117' includes a printed circuit board or printed wire board portion that is shaped similarly to the printed circuit board portion of the first feed circuit design 117, and which may include similar circuitry that may be slightly rearranged due to differences in connection locations between the second feed circuit design 117' from the first feed circuit design 117. Furthermore, the second feed circuits 117' are arranged in a similar configuration as the first feed circuits 117, such that first longitudinal portions of the second feed circuits 117' are positioned to be substantially vertical, with second longitudinal portions of the second feed circuits 117' extending from the first portions in substantially a same direction as the direction of extension of the second portions of the first feed circuits 117.

With respect to the arrangement of the first and second feed circuits 117 and 117' in FIGS. 3A and 3B, the feed circuits 117/117' may be alternately arranged, such that the first feed circuits 117 are positioned in a similar manner as described with respect to FIGS. 2A and 2B above, but are only arranged on one side of each corresponding support 113', with each of the first feed circuits 117 arranged on the same side of each corresponding column 111'. In between the first feed circuits 117, second feed circuits 117' may be positioned, such that vertical portions of each of the second feed circuits 117' are positioned substantially equidistant between vertical portions of the two corresponding adjacent first feed circuits 117. The second feed circuits 117' may be attached, for example, at its base to a corresponding column 111', and/or an end of the second portion of the second feed circuits 117' may be attached to a corner of a corresponding support 113', as best seen in FIG. 3A. In this manner, each of the TRIMM assemblies in FIGS. 3A and 3B may include feed circuits 117/117' on only one of its sides.

The second feed circuit design 117' may include a disk 119' that is positioned at a corner between its first portion and its second portion, rather than having a circular disk 119 at an end of the feed circuit. Furthermore, the TRIMM assemblies in FIGS. 3A and 3B may include supports 113' with magnetic inserts on only one side of the supports 113', on which the feed circuits 117/117' are not located. The magnetic inserts may include first magnetic inserts 201 similarly as seen in FIGS. 2A and 2B, as well as magnetic inserts 201', which may be positioned at or near a middle portion on the same side, as can most clearly be seen in FIG. 3B. Similarly as discussed with respect to the first feed circuit arrangement, the magnetic inserts 201 and 201' may be made of or include neodymium or another material with similar physical and/or magnetic properties, and disks 119 and 119' may be made of or include a ferromagnetic material, such as nickel or a nickel alloy, or any material that may have similar properties.

FIG. 3B shows portions of two adjacent TRIMM assemblies utilizing the second "J" shaped feed circuit arrangement described in FIG. 3A. Referring to FIG. 3B, illustrated are a plurality of supports 113' of two TRIMM assemblies, and their associated feed circuits. The supports of the two TRIMM assemblies are again illustrated in FIG. 3B to be separated by a large gap, for ease of description. Furthermore, similarly as described with respect to FIGS. 2A and 2B, the TRIMM assemblies may be arranged such that the supports are positioned in a similar slant feed or "egg crate" array arrangement.

In addition, in FIG. 3B, it can be seen that each of the disks 119 are substantially aligned with a corresponding magnetic insert 201 of a support 113' of an adjacent TRIMM assembly, and that each of the disks 119' are similarly substantially aligned with a corresponding magnetic insert 201' of the supports 113' of the adjacent TRIMM assembly. In an assembled state, the feed circuits 117 and 117' bridge the gaps between the TRIMM assemblies by electrically connecting a corresponding support 113' with an adjacent support 113' via the magnetic connections between the magnetic inserts 201 and 201' and the disks 119 and 119', respectively. Therefore, similar to the first feed circuit arrangement, the feed circuits in the second feed circuit arrangement facilitate communication between elements of each of the TRIMM assemblies in an array assembly, and contribute to formation of a desired polarization and/or electric field alignment for a corresponding phased array antenna.

As can be seen in the arrangements of FIGS. 2A and 2B and FIGS. 3A and 3B, similar "J" shaped feed circuits are utilized to facilitate communication between adjacent TRIMM assemblies in a phased array antenna. Similar "J" shapes are generally utilized to reduce manufacturing costs, since each of the feeds in both arrangements can utilize the same or similar printed circuit board design and/or layout. However, the structure of the "J" shaped feed circuits themselves is relatively weak, and provides less than desirable internal structural stability. Furthermore, in each of the above feed circuit arrangements, two separate types of feed circuits must be manufactured. For example, in the first feed circuit arrangement, feed circuits 117 on opposite sides of each support 113 are formed with at least disks 119 located on opposite sides of the second longitudinal portions. In addition, in the second feed circuit arrangement, first feed circuits 117 and second feed circuits 117' include disks 119 and 119' having different shapes and located on different portions of their respective feed circuits 117/117'. Finally, with respect to at least the second feed circuits 117', in an assembled position, a majority of the feed circuit 117' is not supported and hangs in space, potentially leading to awkward distortion of the feed circuit 117' once a magnetic connection is established with an adjacent support, or such feed circuits 117' may be damaged during assembly of such systems.

As such, embodiments of the present invention include an improved feed circuit design that can be utilized in place of the above "J" shaped feed circuit designs.

Figure 4B:
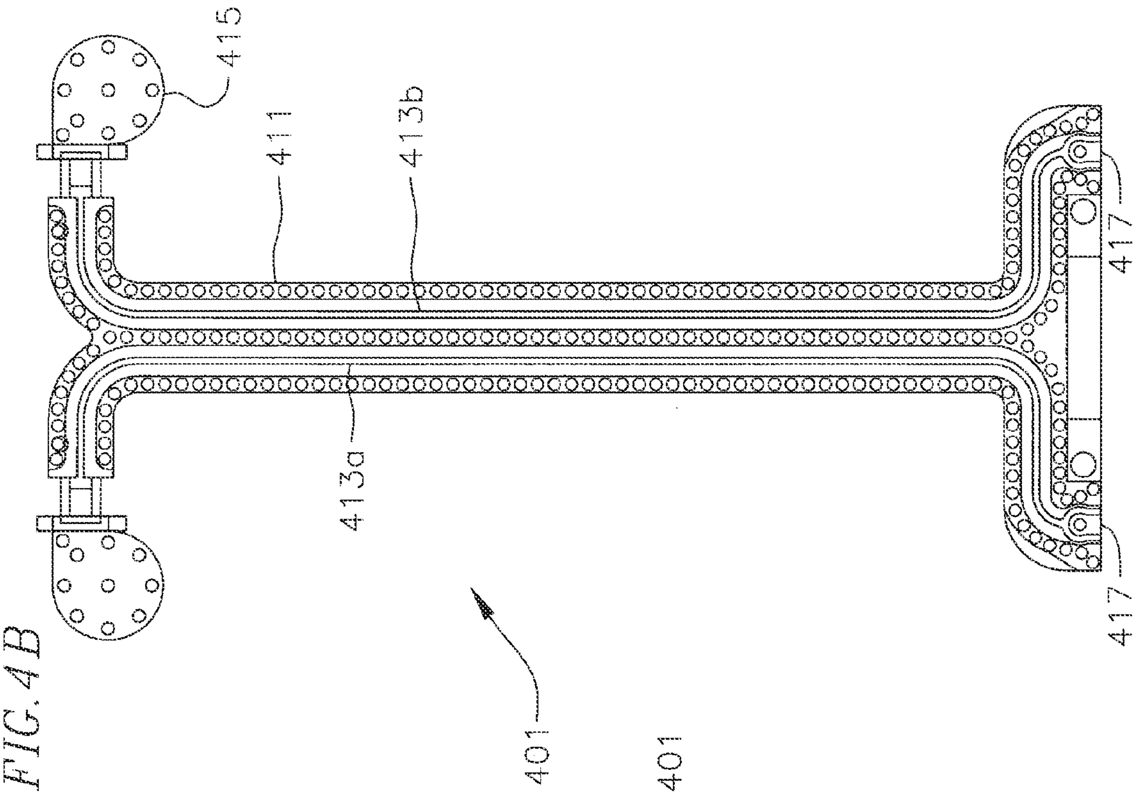
FIGS. 4A and 4B respectively illustrate a first side and an internal configuration of a feed circuit design according to an embodiment of the present invention.
Figure 4A:
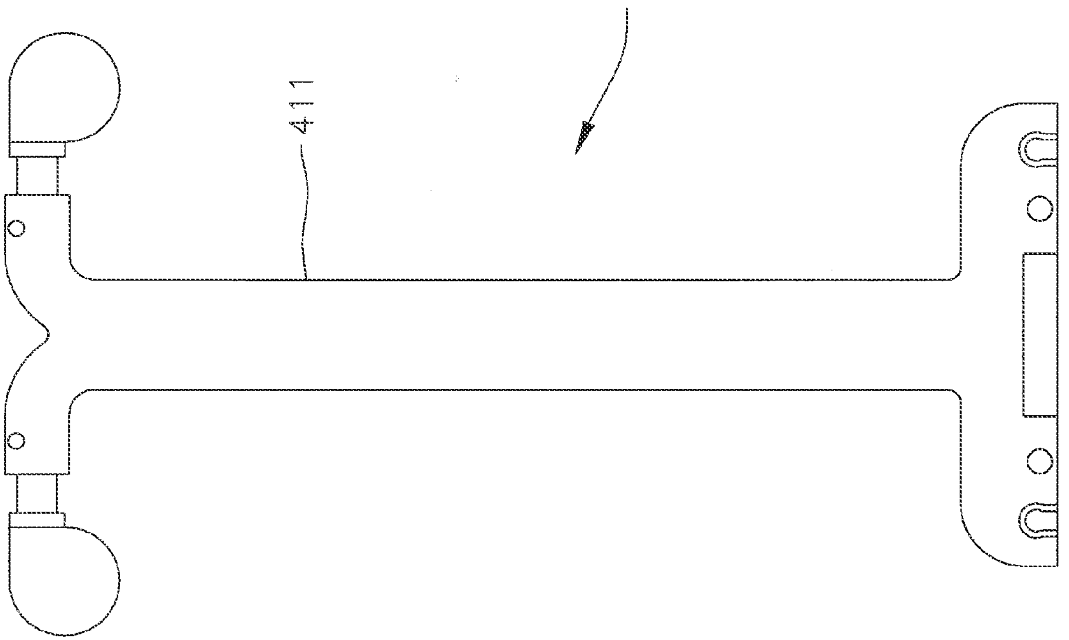

FIGS. 4A and 4B respectively illustrate a first side and an internal configuration of a feed circuit design according to an embodiment of the present invention. Referring to FIGS. 4A and 4B, a feed circuit 401 according to an embodiment of the present invention may include a printed circuit board or printed wire board 411, and one or more traces 413*a* and 413*b*, either on at least one side of the printed circuit board 411, or realized as an internal stripline circuit, for providing electrical connectivity between different areas of the feed circuit 411.

The printed circuit board 411 may include a substrate that includes, for example, a liquid crystal polymer, or various other plastics or other material with similar electrical and/or mechanical properties. Generally, the printed circuit board 411 maintains high mechanical strength at elevated temperatures, has relatively low dielectric constants and the like, and be generally unreactive and inert. Furthermore, since the feed circuits 401 are intended to bridge gaps between adjacent TRIMM assemblies in an array assembly, and should be able to compensate for minor manufacturing variances between the TRIMM assemblies, the selected material should be relatively flexible to accommodate for such manufacturing differences.

Rather than a "J" shape as was seen in previous feed circuits, the printed circuit board 411 in the present embodiment is instead a substantially "I" shaped board, with a first longitudinal section which may include an approximate axis of symmetry, second portions that extend in opposite directions at one end of the first portion, and third portions that extend in opposite directions at an opposite end of the first portion. The first, second, and third portions of the printed circuit board 411 may lie substantially in a same plane, and may substantially form the shape of an "I."

The shape of the printed circuit board 411 facilitates the inclusion of at least two separate circuit traces 413*a* and 413*b*, which may extend from first connection areas 415 to second connection areas 417. In some embodiments, the traces 413*a* and 413*b* may be internal stripline circuits. Furthermore, the traces 413*a* and 413*b* may be arranged as mirror images of one another with respect to an axis of symmetry of the printed circuit board 411. The first connection areas 415 may be located on the second portions of the printed circuit board 411, while the second connection areas 417 may be located on the third portions of the printed circuit board 411, such that the traces 413*a* and 413*b* connect the first connection areas 415 with the second connection areas 417. In this manner, the feed circuit design in FIGS. 4A and 4B provide a dual polarization characteristic, for providing separate connections to two connection points on an adjacent TRIMM assembly and facilitating signal polarization in two separate directions between the TRIMM assembly to which the feed circuit is attached and the adjacent TRIMM assembly.

In the embodiment of FIGS. 4A and 4B, the second portions are longer than the third portions, but embodiments of the invention should not be limited thereto. That is, in some embodiments, the third portions may be substantially the same length as or longer than the second portions, depending on the positioning of contacts in a particular assembly. Furthermore, while the second portions in FIGS. 4A and 4B are illustrated as terminating in substantially circular configurations, while the third portions are illustrated as ending in a more moderately curved or tapered configuration, other embodiments may include various other shapes and/or sizes depending on the particular application.

The second portions of the printed circuit board 411 should generally be shaped and sized to easily attach disks similar to disks 119 as seen in FIGS. 2A, 2B, 3A, and 3B. In the embodiment of FIGS. 4A and 4B, such disks may be made in a circular shape to substantially match the circular shape of the first connection areas 415 illustrated. An example of such disks can more clearly be seen in FIG. 5A, which will be described in more detail below. In exemplary embodiments, the disks may be made of or include a ferromagnetic material such as, for example, nickel, a nickel alloy, or any materials or alloys with similar properties or characteristics. The selected material should have high strength properties at high temperatures, and should exhibit strong and stable magnetic connectivity with the material or materials selected for the magnetic inserts to be included on supports of the TRIMM assemblies, which will also be described in more detail below with respect to FIGS. 5A and 5B. The disks can be attached to the first connection areas 415 of the printed circuit board 411 via an epoxy or any other type of suitable adhesive.

The second connection areas 417 of the printed circuit board 411 may be or include wirebond pads to facilitate convenient electrical connectivity between the feed circuit 401 and a corresponding portion, for example, an electrical component, of a TRIMM assembly to which the feed circuit 401 is attached. In this manner, the feed circuit 401 may connect an associated component or circuitry to which it is attached (e.g., via the wirebond pads 417) with two separate supports on an adjacent TRIMM assembly (e.g., via disks associated with the first connection areas 415 described above).

Figure 5A:
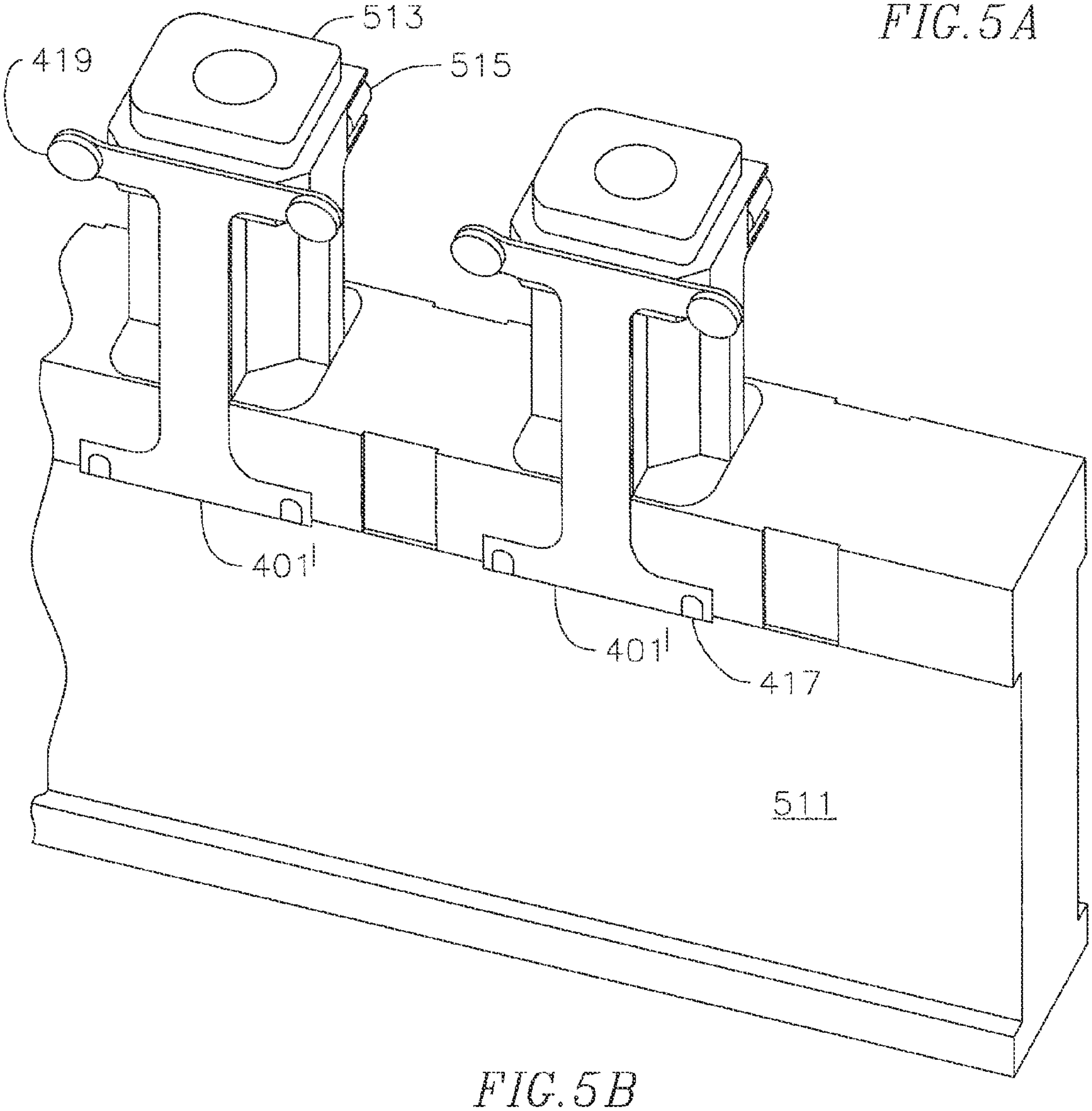
FIG. 5A illustrates a perspective view of a portion of a TRIMM assembly utilizing a feed circuit design according to an embodiment of the present invention.
Figure 5B:
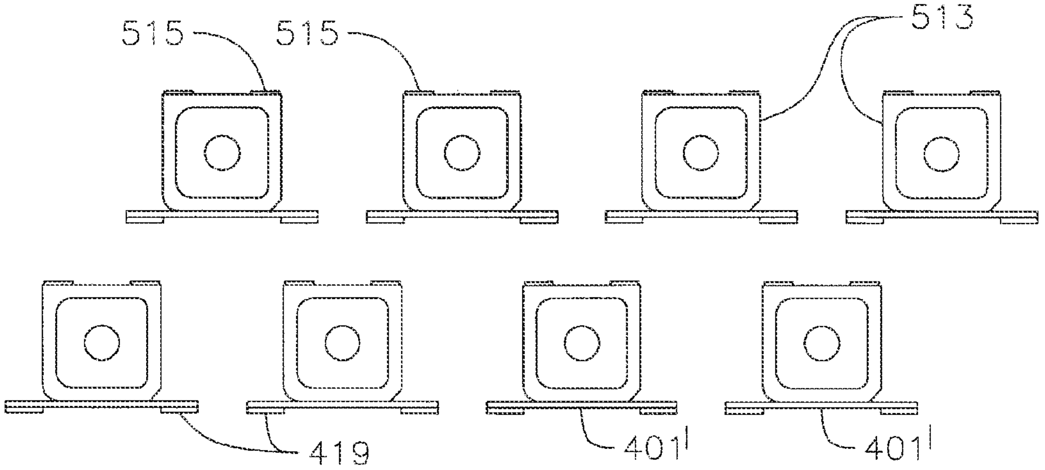
FIG. 5B is a top view showing supports of two partial TRIMM assemblies utilizing the feed circuit design of FIG. 5A.

Referring now to FIGS. 5A and 5B, FIG. 5A illustrates a perspective view of a portion of a TRIMM assembly utilizing a feed circuit design according to an embodiment of the present invention. FIG. 5B is a top view showing supports of two partial TRIMM assemblies utilizing the feed circuit design according to the embodiment of FIG. 5A. In FIGS. 5A and 5B, the feed circuit design 401' may be substantially similar in structure to the feed circuit design 401 discussed above with respect to FIGS. 4A and 4B. Referring first to FIG. 5A, the feed circuit 401' includes a printed circuit board or printed wire board portion that is shaped similarly to the printed circuit board 411 in FIGS. 4A and 4B, including a first longitudinal portion, second portions extending in opposite directions from one end of the first portion, and third portions extending in opposite direction from the other end of the first portion, substantially forming the shape of an "I." In addition, the feed circuits 401' may include similar circuitry as the circuitry seen with respect to feed circuits 401.

Referring now to columns 511, the columns 511 are arranged similarly to columns which were previously described, with a plurality of supports 513 extending from the columns 511, the supports 513 serving, for example, as posts for holding radiating elements associated with the phased array antenna.

In the embodiment of FIGS. 5A and 5B, the feed circuits are arranged on only one side of each of the columns 511, and are attached to corresponding supports 513, such that the first portion of the feed circuits 401' is positioned to be substantially vertical along approximately a middle or center of a side of the corresponding support 513. Here, the feed circuits 401' may be utilized to facilitate electrical communication and/or energy transfer between TRIMM assemblies, and more specifically between the corresponding support 513 and at least two supports 513 of an adjacent TRIMM assembly, as well as between their associated radiating elements. Therefore, each feed circuit 401' is stably supported against a corresponding support post 513, without the need for an additional feed circuit 401' on an opposite side of the support post 513, or any additional feed circuits between the feed circuits 401' attached to the support posts 513. In this manner, a number of feed circuits can be reduced by about a factor of two, and assembly of the feed circuits onto the TRIMM assemblies can be simplified. Furthermore, since the structure of the feed circuits is better supported, and there are no feed circuits that are awkwardly positioned or substantially hanging in space, structural stability of the feed circuits can also be improved.

Since each of the feed circuits 401' according to the present embodiment includes two separate stripline circuits and two separate sets of connectors which serve to replace two feed circuits from conventional arrangements, each of the feed circuits 401' therefore provides an arrangement which facilitates dual polarization. That is, the feed circuit 401' separately connects its associated circuitry with two support posts that may be located or arranged in substantially different directions with respect to the support post 513 to which the feed circuit 401' is attached. The feed circuit 401' can thereby establish or facilitate signal polarization along respective axes that may substantially correspond to the connection directions between the support post 513 to which the feed circuit 401' is attached (and/or its associated radiating element) and the two connected support posts and/or their associated radiating elements, where the respective axes cross one another. For example, in some embodiments, the respective axes of signal polarization corresponding to a feed circuit 401' may be substantially perpendicular to one another.

Along a bottom of each of the feed circuits 401' are positioned wirebond pads 417, similarly as described with respect to the feed circuits 401 in FIGS. 4A and 4B. The wirebond pads may be wirebonded to or otherwise electrically connected to corresponding components (e.g., electrical components) associated with the TRIMM assembly to which the feed circuit 401' is attached, thereby conductively bonding and establishing an electrical connection between, for example, the corresponding components on the TRIMM assembly to which the feed circuit is attached and a magnet in a corresponding support post on an adjacent TRIMM assembly. Additional circuitry may be provided on or in the TRIMM assembly to facilitate operations of the phased array antenna. In one embodiment, spacing between adjacent electrical components on the TRIMM assemblies may be, for example, 0.2404 inches, and the spacing between wirebond pads 417 on the feed circuits 401' may substantially match this component spacing. However, this is merely an example, and spacing between lead connections and the wirebond pads may vary depending on the varying structures of different systems.

Furthermore, as briefly discussed above with respect to FIGS. 4A and 4B, disks 419 may be attached at first connection areas of the feed circuits 401'. The disks 419 can be attached by using, for example, an epoxy or similar resin or adhesive. In FIG. 5A, the disks 419 again are illustrated as being substantially circular, but the disks can be of any appropriate shape, based for example, on the corresponding shape of the first connection areas.

The supports 513 may include magnetic disks or inserts 515. The magnetic inserts 515 may be provided on the supports 513 as illustrated in FIGS. 5A and 5B, or may be otherwise provided and positioned based on corresponding configurations of the feed circuits 401' or of other features of the phased array antenna. As can most clearly be seen in FIG. 5B, the magnetic inserts 515 in the present embodiment are only provided on the side of the supports 513 on which a corresponding feed circuit 401' is not provided, which may be a side opposite the side having the feed circuit 401', and may be positioned on opposing edges of said side, such that they are substantially aligned with the feed circuits 401' of an adjacent TRIMM assembly.

FIG. 5B shows portions of two adjacent TRIMM assemblies utilizing the feed circuit design described in FIG. 5A. Referring to FIG. 5B, a plurality of supports 513 from two TRIMM assemblies are illustrated along with their associated feed circuits 401'. The supports of the two TRIMM assemblies are illustrated in FIG. 5B to be separated by a large gap, for ease of description, but it is to be understood than in an assembled state, the two TRIMM assemblies are more closely arranged, such that the disks 419 of the feed circuits 401' of one of the TRIMM assemblies are able to come into contact with the magnetic inserts 515 of an adjacent TRIMM assembly. Furthermore, similarly as described above, the TRIMM assemblies may be arranged such that supports are staggered and arranged to be in a slant feed or "egg crate" arrangement.

It can be seen in FIG. 5B that each of the disks 419 are substantially aligned with a corresponding magnetic insert 515 of a support 513 of an adjacent TRIMM assembly. Furthermore, each of the feed circuits 401' includes two disks 419, such that each feed circuit 401' is connectable to two separate supports 513 of the adjacent TRIMM assembly.

In an assembled state, the feed circuits 401' bridge the gaps between the TRIMM assemblies by electrically connecting a corresponding support 513 with adjacent supports 513 via the magnetic connections between the magnetic inserts 515 and the disks 419. As with previous feed circuit designs, magnetic inserts 515 may be made of or include neodymium or a neodymium alloy, or any other magnetic material which exhibits similar properties, while disks 419 may be made of or include a ferromagnetic material such as nickel or a nickel alloy, or any similar material or alloy that exhibits similar properties. In the present embodiment, the magnetic inserts 515 include neodymium due to its high magnetic strength, low mass, and low cost. However, any other similar suitable magnets may also be utilized for the magnetic inserts 515. Furthermore, nickel disks 419 are utilized for their ability to withstand elevated temperatures, as well as their relatively strong magnetic connection to neodymium, and the relatively low costs of the combination of materials. However, as with the magnetic inserts 515, any other suitable material can also be substituted for the disks 419.

Figure 6:
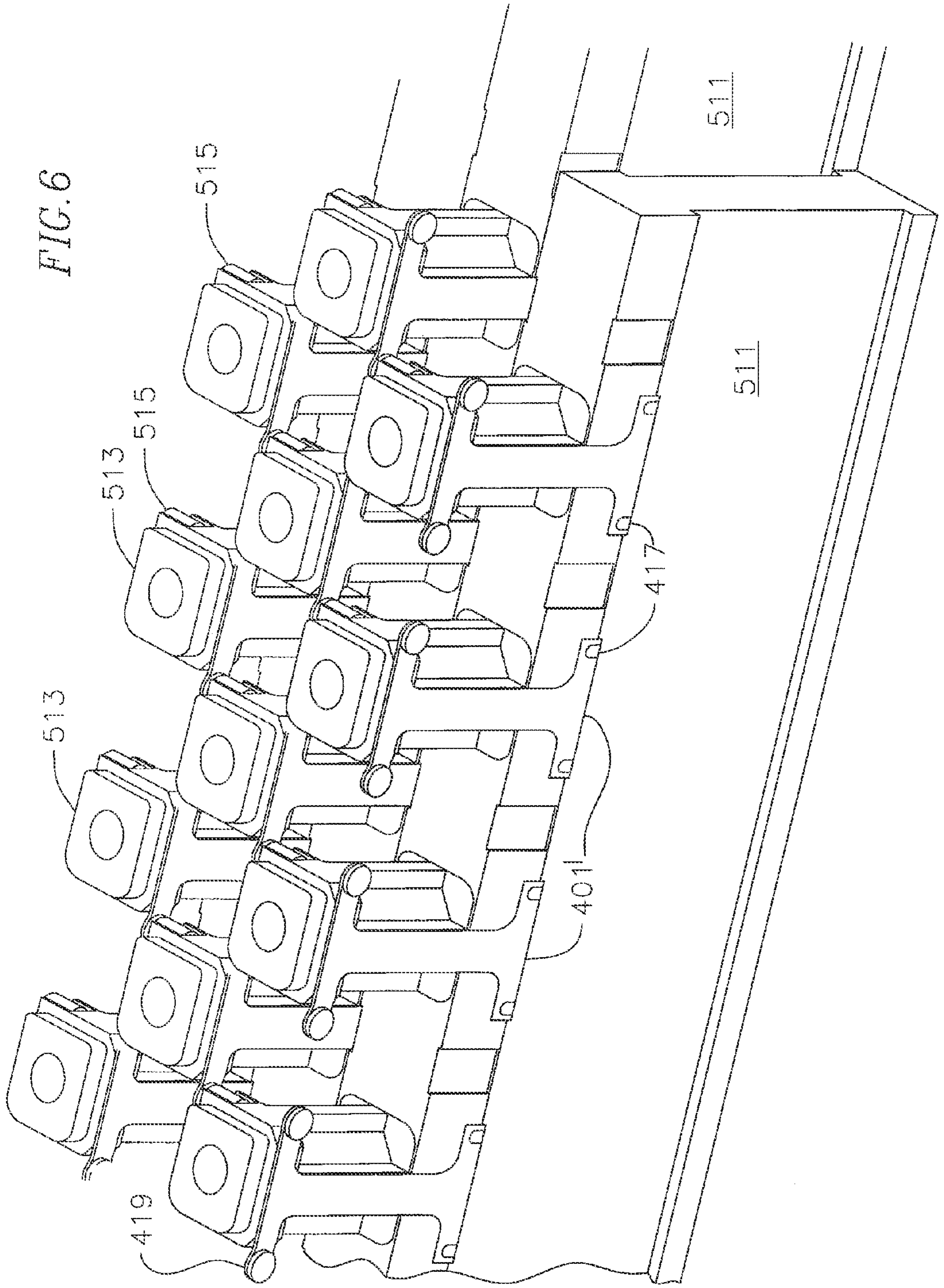
FIG. 6 shows a perspective view of portions of a plurality of TRIMM assemblies of a phased array antenna utilizing a feed circuit design in an assembled state according to an embodiment of the present invention.

FIG. 6 shows a perspective view of a portion of a phased array antenna utilizing a feed circuit design in an assembled state according to an embodiment of the present invention. In FIG. 6, the array assembly includes a plurality of TRIMM assemblies each including a column portion 511 and a plurality of support posts 513. Attached to each of the support posts is a corresponding feed circuit 401' according to an embodiment of the present invention. The TRIMM assemblies are arranged similarly as described above, with the support posts 513 arranged to be in a slant feed or "egg crate" array arrangement. The feed circuit 401' of each support post may be electrically connected to corresponding electrical components on the TRIMM assembly to which the feed circuit 401' is mounted via a wirebond pad 417 or any similar suitable electrical connection. In addition, each feed circuit 401' facilitates communication between its corresponding support post 513 and adjacent support posts 513 via a connection between disks 419 of the feed circuit 401' and magnetic inserts 515 of the adjacent support posts 513 that are aligned with the disks 419.

As can be seen above, electrical communication or energy transfer can be more readily facilitated between supports and their associated radiating elements by utilizing feed circuits according to embodiments of the present invention. Accordingly, the feed circuits according to embodiments of the present invention facilitate communication between each of the TRIMM assemblies in an array assembly, and contribute to formation of a desired polarization and/or electric field alignment for a corresponding phased array antenna. In addition, the feed circuits according to embodiments of the present invention reduce the number of parts in an array assembly because each can be substituted for two conventional feed circuits, simplifying the structure of the assemblies and reducing manufacturing costs. Manufacturing costs may also be reduced because only one type of feed circuit needs to be manufactured. Furthermore, since each of the feed circuits according to embodiments of the present invention are stably supported on a corresponding support post, structural integrity and stability of the feed circuits is improved, and the connections and communication they facilitate are more reliable as a result.

While the above arrangements and configurations serve as examples in which embodiments of the present invention can be applied, it is to be understood that the application of the embodiments of the present invention should not be limited to the above systems, and that the present invention can be similarly applied to various other applications in which it may be desirable, for example, to facilitate electrical communication or energy transfer across gaps, while accounting for manufacturing tolerances that may cause gap sizes in an apparatus to vary. Therefore, the flexibility of such feed circuits may allow for an apparatus to be manufactured and adjusted without taking into account such manufacturing tolerances.

In some embodiments, the assemblies described above may be modified, or additional features may be added to or supplement the assemblies, without departing from the spirit or scope of the present invention. Therefore, while the present invention has been described in connection with certain exemplary embodiments, it is to be understood that the invention is not limited to the disclosed embodiments, but is intended to cover various modifications and equivalent arrangements included within the spirit and scope of the appended claims, and equivalents thereof.

What is claimed is:

1. A feed circuit for connecting adjacent components, comprising:

a printed circuit board having a first portion and an axis of symmetry extending along a longitudinal direction of the first portion, second portions extending in substantially opposite directions from one end of the first portion, and third portions extending in substantially opposite directions from another end of the first portion;

at least two circuits electrically connecting respective ones of the second portions with corresponding ones of the third portions; and connection areas at each of the second portions configured to be connected to one of the adjacent components, and at each of the third portions configured to be connected to another one of the adjacent components.

2. The feed circuit of claim 1, wherein the feed circuit is configured to connect adjacent components of an antenna assembly.

3. The feed circuit of claim 1, wherein the respective ones of the second portions are located on a same side of the axis of symmetry as the respective corresponding third portions.

4. The feed circuit of claim 1, further comprising disks comprising a ferromagnetic material coupled to the connection areas at each of the second portions.

5. The feed circuit of claim 4, wherein the ferromagnetic material comprises nickel.

6. The feed circuit of claim 1, wherein the connection area at least one of the third portions comprises a wirebond pad.

7. The feed circuit of claim 1, wherein the printed circuit board comprises a substrate comprising liquid crystal polymer.

8. The feed circuit of claim 1, wherein at least one of the at least two circuits comprises an internal stripline circuit.

9. An assembly comprising:

a plurality of components spaced apart from one another; and at least one feed circuit for connecting at least two adjacent ones of the components, the at least one feed circuit comprising:

a printed circuit board having a first portion and an axis of symmetry extending along a longitudinal direction of the first portion, second portions extending in substantially opposite directions from one end of the first portion, and third portions extending in substantially opposite directions from another end of the first portion;

at least two circuits electrically connecting respective ones of the second portions with corresponding ones of the third portions; and connection areas at each of the second portions and at each of the third portions.

10. The assembly of claim 9, wherein each of the plurality of components comprises a plate-shaped base portion and a plurality of support posts extending in substantially a same direction from an end of the base portion, and wherein the at least one feed circuit is configured to connect electrical components adjacent to a corresponding support post on one of the base portions with at least two support posts on an adjacent one of the base portions.

11. The assembly of claim 10, wherein the at least one feed circuit is connected to the electrical components via at least one wirebond pad located at the connection area of one of the third portions of the at least one feed circuit.

12. The assembly of claim 10, wherein the at least one feed circuit is configured to provide signal polarization along a first axis towards one of the at least two support posts on the adjacent one of the base portions, and signal polarization along a second axis that crosses the first axis towards another one of the at least two support posts on the adjacent one of the base portions.

13. The assembly of claim 10, wherein the at least two support posts on the adjacent one of the base portions each comprises at least one magnetic insert, wherein the at least one feed circuit further comprises a disk comprising a ferromagnetic material coupled to the connection areas at each of the second portions, and wherein the disks are configured to contact the magnetic inserts of the at least two support posts on the adjacent one of the base portions via a magnetic force.

14. The assembly of claim 13, wherein the contacts between the disks and the magnetic inserts form respective electrical connections between the disks and the magnetic inserts.

15. The assembly of claim 13, wherein at east one of the magnetic inserts comprises neodymium.

16. The assembly of claim 13, wherein the ferromagnetic material comprises nickel.

17. The assembly of claim 10, wherein the at least one feed circuit is attached to a side of the corresponding support post, such that the first portion of the at least one feed circuit extends substantially along a longitudinal direction of the corresponding support post.

18. The assembly of claim 17, comprising a plurality of feed circuits attached to respective ones of the support posts on the one of the base portions, wherein the plurality of feed circuits are arranged to be on a same side of the one of the base portions.

* * * * *

UNITED STATES PATENT AND TRADEMARK OFFICE

CERTIFICATE OF CORRECTION

PATENT NO. : 8,665,600 B2
APPLICATION NO. : 12/955394
DATED : March 4, 2014
INVENTOR(S) : Ryan Wernicke It is certified that error appears in the above-identified patent and that said Letters Patent is hereby corrected as shown below:

On the Title page, item (73) Assignee, please replace "Ratheon" with -- Raytheon --

Signed and Sealed this
Thirteenth Day of May, 2014

Michelle K. Lee

Michelle K. Lee
*Deputy Director of the United States Patent and Trademark Office*